(12) United States Patent
Chen et al.

(10) Patent No.: US 12,283,493 B2
(45) Date of Patent: Apr. 22, 2025

(54) PACKAGING STRUCTURE RADIATING ELECTROMAGNETIC WAVES IN HORIZONTAL DIRECTION AND METHOD MAKING THE SAME

(71) Applicant: SJ Semiconductor(Jiangyin) Corporation, Jiangyin (CN)

(72) Inventors: Yenheng Chen, Jiangyin (CN); Chengchung Lin, Jiangyin (CN)

(73) Assignee: SJ Semiconductor (Jiangyin) Corporation, JiangSu (CN)

( * ) Notice: Subject to any disclaimer, the term of this patent is extended or adjusted under 35 U.S.C. 154(b) by 467 days.

(21) Appl. No.: 17/704,752

(22) Filed: Mar. 25, 2022

(65) Prior Publication Data
US 2022/0319870 A1    Oct. 6, 2022

(30) Foreign Application Priority Data

Apr. 6, 2021  (CN) .......................... 202110368756.1
Apr. 6, 2021  (CN) .......................... 202120693760.0

(51) Int. Cl.
*H01L 21/56* (2006.01)
*H01L 21/60* (2006.01)
*H01L 21/67* (2006.01)

(52) U.S. Cl.
CPC ............ *H01L 21/565* (2013.01); *H01L 21/60* (2021.08); *H01L 21/67138* (2013.01); *H01L 2021/6003* (2013.01)

(58) Field of Classification Search
CPC . H01L 21/565; H01L 21/60; H01L 21/67138; H01L 2021/6003; H01L 24/13; H01L 24/81; H01L 23/562; H01L 24/16; H01L 24/32; H01L 24/83; H01L 2221/68345; H01L 2224/11334; H01L 2224/131; H01L 2224/13111; H01L 2224/13144; H01L 2224/13147; H01L 2224/16237; H01L 2224/2919; H01L 2224/32225; H01L 2224/73204; H01L 2224/81192; H01L 2224/81424; H01L 2224/81439; H01L 2224/81444; H01L 2224/81447; H01L 2224/83102;
(Continued)

(56) References Cited

U.S. PATENT DOCUMENTS 10,867,938 B2 * 12/2020 Tang ................. H01L 24/19
2018/0158787 A1 * 6/2018 Chang ............... H01L 23/49822

* cited by examiner

*Primary Examiner* — Jonathan Han
(74) *Attorney, Agent, or Firm* — IPRTOP LLC

(57) ABSTRACT

The present disclosure provides an antenna packaging structure radiating electromagnetic waves in a horizontal direction parallel to the device plane and a method making the same. The method includes: providing a support substrate, and forming a separation layer; forming a rewiring layer on the separation layer; forming an antenna array layer on the rewiring layer, the antenna array layer is electrically connected to the metal wire layer; the antenna array layer includes a plurality of antennas which radiates e-m waves in a horizontal direction; each antennas comprises first metal sheets extending along a first direction and second metal sheets extending along a second direction, the first metal sheets are arranged with sheets in parallel and spaced by an sheet-to-sheet interval, second metal sheets are arranged with sheets in parallel and spaced by an sheet-to-sheet interval; forming a molding material layer, which molds the antenna array layer.

10 Claims, 4 Drawing Sheets

(58) Field of Classification Search
CPC ... H01L 2224/83488; H01L 2224/8349; H01L 2224/92125; H01L 21/6835; H01Q 1/2283; H01Q 21/061
See application file for complete search history.

PACKAGING STRUCTURE RADIATING ELECTROMAGNETIC WAVES IN HORIZONTAL DIRECTION AND METHOD MAKING THE SAME

CROSS REFERENCE TO RELATED APPLICATION

The present application claims the benefit of priority to Chinese Patent Application No. CN2021103687561, entitled "Antenna Packaging Structure Radiating Electromagnetic Waves in Horizontal Direction and Method Making the Same", filed with CNIPA on Apr. 6, 2021, and Chinese Patent Application No. 2021206937600, entitled "Antenna Packaging Structure Radiating Electromagnetic Waves in Horizontal Direction", filed with CNIPA on Apr. 6, 2021, the content of which is incorporated herein by reference in their entireties.

FIELD OF TECHNOLOGY

The present disclosure relates to the technical field of semiconductor packaging, in particular, to an antenna packaging structure radiating electromagnetic waves (e-m waves) in a horizontal direction and a method making the same.

BACKGROUND

With the advent of the era of 5G communication and artificial intelligence, the amount of data to be transmitted and processed interactively at high speed by chips used in related fields has been increasing, and the demand for mobile Internet and Internet of Things has been tremendous. Miniaturization and multi-functionalization of electronic terminal products are currently the general trend in the industry. How to integrate and package together different types of high-density chips on one small size system with powerful functions at low power consumption has become a major challenge in the field of advanced packaging of semiconductor chips.

Fan-out packaging technology can integrate multiple chips and has better performance than carrier-based system-in-package. The industry is generally optimistic about applying fan-out packaging technology in the integrated packaging of 5G RF front-end chips in the future. Fan-Out Wafer Level Packaging (FOWLP) combines the advantages of fan-out packaging and wafer-level packaging technology, can fully meet the needs for multi-function, high performance, high energy efficiency, low cost, and small size of electronic devices, and has emerged as one of the most promising packaging technologies to meet the needs of electronic devices for mobile and network applications.

To further reduce the device area, the antennas have been integrated into the fan-out wafer-level packaging structure, but in the existing techniques, only the antenna designs radiating e-m waves in the vertical direction are usually adopted. Due to the process limit of the molding thickness, the design of the antennas is more difficult than ever, which hinders the further miniaturization of the device.

SUMMARY

The present disclosure provides an antenna packaging structure which radiates e-m waves in a horizontal direction and a method making the same, to improve the antenna design from the traditional fan-out package structures which only enable radiation in the vertical direction, and due to the process limit of the molding thickness, the design of the antennas is more difficult.

The method includes: providing a support substrate in the horizontal direction, and forming a separation layer on the support substrate; forming a rewiring layer on the separation layer, the rewiring layer includes a dielectric layer and a metal wire layer placed in the dielectric layer and on a surface of the dielectric layer; forming an antenna array layer on the rewiring layer, the antenna array layer is electrically connected to the metal wire layer; the antenna array layer includes a plurality of antennas arranged in an array, the plurality of antennas radiates electromagnetic waves in a horizontal direction; the plurality of antennas includes a plurality of first metal sheets extending along a first direction and a plurality of second metal sheets extending along a second direction, the plurality of first metal sheets is arranged with sheets in parallel and spaced by a sheet-to-sheet interval from each other, the plurality of second metal sheets is arranged with sheets in parallel and spaced by a sheet-to sheet interval from each other, and two ends of each of the plurality of second metal sheets are respectively connected to the plurality of first metal sheets; the first direction is not parallel to the second direction; forming a molding material layer, the molding material layer molds the antenna array layer; removing the support substrate and the separation layer; forming solder ball bumps on a surface of the rewiring layer away from the antenna array layer, the solder ball bumps are electrically connected to the metal wire layer; and disposing the chip on the solder ball bumps.

Optionally, after removing the support substrate and the separation layer, the method further includes: forming openings in the dielectric layer, the openings expose the metal wire layer, and forming the solder ball bumps in the openings.

Optionally, the plurality of antennas each comprises two first metal sheets and two second metal sheets, and wherein the first direction is perpendicular to the second direction.

Optionally, the support substrate includes a glass substrate; the separation layer includes a release layer and a protective layer, the release layer is formed on a surface of the support substrate, and the protective layer is formed on a surface of the release layer facing away from the support substrate; the release layer includes one or more of a carbon material layer, a resin material layer, and an organic material layer, and the protective layer includes a polyimide layer.

Optionally, after the rewiring layer is formed, the method further includes: forming an under bump metallurgy (UBM) layer on a surface of the rewiring layer, the UBM layer is electrically connected to the metal wire layer, and the antenna array layer is formed on the surface of the UBM layer and is electrically connected to the UBM layer.

The present disclosure further provides an antenna packaging structure radiating e-m waves in a horizontal direction. The antenna packaging structure includes: a rewiring layer, an antenna array layer, a molding material layer, solder ball bumps, and a chip.

The rewiring layer includes a first surface and a second surface opposite to the first surface, and the rewiring layer includes a dielectric layer and a metal wire layer placed in the dielectric layer and on a surface of the dielectric layer.

The antenna array layer is placed on the first surface of the rewiring layer and electrically connected to the metal wire layer. The antenna array layer includes a plurality of antennas arranged in an array, the plurality of antennas radiates e-m waves in the horizontal direction. The plurality of antennas includes a plurality of first metal sheets extending along a first direction and a plurality of second metal sheets extending along a second direction, the plurality of first metal sheets is arranged with sheets in parallel and spaced by a sheet-to-sheet interval from each other, the plurality of second metal sheets is arranged with sheets in parallel and spaced by a sheet-to-sheet interval from each other, and two ends of each of the plurality of second metal sheets are respectively connected to the plurality of first metal sheets. The first direction is not parallel to the second direction.

The molding material layer is placed on the first surface of the rewiring layer and molds the antenna array layer.

The solder ball bumps are placed on the second surface of the rewiring layer and connected electrically to the metal wire layer.

The chip is electrically connected to the solder ball bumps.

Optionally, the antenna packaging structure radiating e-m waves in the horizontal direction further includes an under bump metallurgy layer, the under bump metallurgy layer is placed on the second surface of the rewiring layer, and two ends of the under bump metallurgy are respectively electrically connected to the metal wiring layer and the solder ball bumps.

Optionally, the antenna packaging structure radiating e-m waves in the horizontal direction further includes an underfill layer, the underfill layer is placed between the chip and the solder ball bumps.

Optionally, the plurality of antennas each comprises two first metal sheets and two second metal sheets.

Optionally, the first direction is perpendicular to the second direction.

As mentioned above, in the antenna packaging structure radiating e-m waves in the horizontal direction and the method making the same of the present disclosure, the antennas are designed to radiate in a horizontal direction, and the thickness of the antennas do not need to be very high, thereby reducing the thickness of the molding layer of the molding antenna layer, helping to increase the frequency of the antennas and further reduce the size of the device, and the antenna structure can be flexibly designed according to the requirements of the device because the expansion space of the antennas in the horizontal direction is large, which helps to improve the performance of the device.

BRIEF DESCRIPTION OF THE DRAWINGS

FIG. 10 also shows a schematic cross-sectional view of the antenna packaging structure radiating e-m waves in the horizontal direction according to the present disclosure.

DESCRIPTION OF THE REFERENCE NUMERALS

Figure 1:
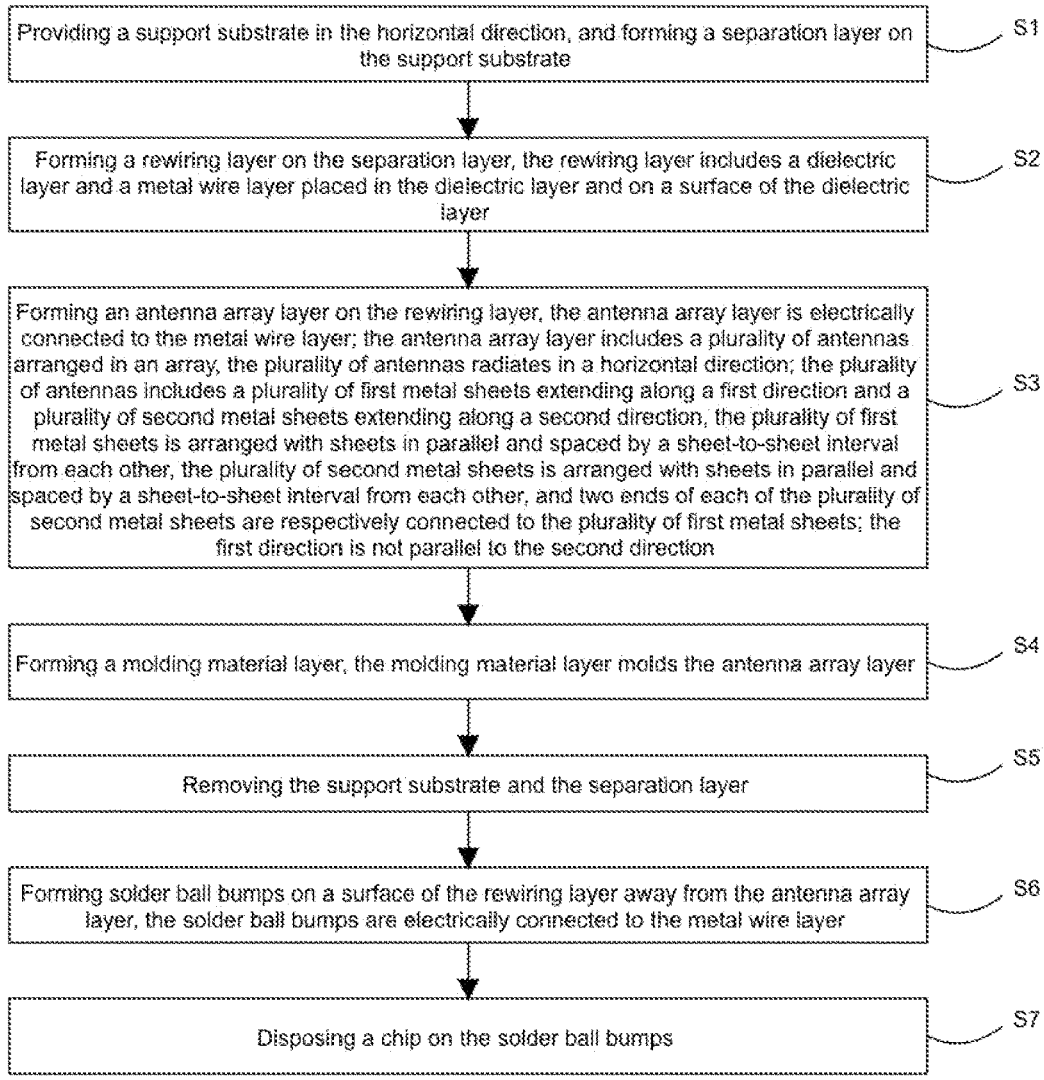
FIG. 1 shows a schematic flowchart of a method for manufacturing an antenna packaging structure radiating e-m waves in a horizontal direction according to the present disclosure.

11 Support substrate
12 Release layer
13 Protective layer
14 Dielectric layer
141 Opening
15 Metal wire layer
16 Antenna
161 First metal sheet
162 Second metal sheet
17 molding material layer
18 Solder ball bump
19 Chip
20 Under bump metallurgy layer

DETAILED DESCRIPTION

The implementation mode of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

When describing the embodiments of the present disclosure in detail, for the convenience of description, the cross-sectional views showing the device structure will not be partially enlarged according to the general scale, and the schematic diagrams are only examples, which should not limit the protection scope of the present disclosure. In addition, the three-dimensional spatial dimensions of length, width, and depth should be included in the actual production.

For convenience of description, spatially relative terms such as "under," "below," "lower," "down," "above," "on," etc. may be used herein to describe the relationship of an element or a feature to other components or features shown in the drawings. It will be understood that these spatially relative terms are intended to encompass other directions of the device in use or operation than those depicted in the drawings. In addition, when a layer is referred to as being 'between' two layers, it can be the only layer between the two layers, or one or more intervening layers between the two layers. In the present disclosure, when referring to the description of the numerical range, unless otherwise specified, the endpoint values are all included.

In some embodiments of the present disclosure, when a first feature is "on" a second feature, the first feature and the second feature may be formed in direct contact, or additional features may be formed between the first feature and the second feature, in this way, the first feature and the second feature may not be in direct contact.

It needs to be stated that the drawings provided in the following embodiments are just used for schematically describing the basic concept of the present disclosure, thus only illustrating components only related to the present disclosure and are not drawn according to the numbers, shapes, and sizes of components during actual implementation, the configuration, number, and scale of each component during actual implementation thereof may be freely changed, and the component layout configuration thereof may be more complicated.

Traditional fan-out wafer-level packaging antenna structures usually only adopt designs which have a single vertical radiation direction. To improve the antenna performance, it is usually necessary to ensure that antennas have a certain thickness, and the molding material layer of the antennas is usually made thick enough to ensure the complete packaging of the antenna. However, the traditional molding material layer has a limit in the thickness due to its deposition process, which limits the antenna design. Therefore, the present disclosure proposes improvement measures.

Figure 2:
FIGS. 2-10 show schematic views of the structures after each step of the manufacturing process according to the method of FIG. 1 of the present disclosure.
Figure 3:
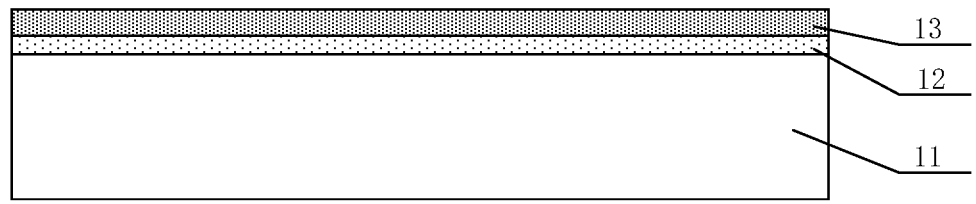

Specifically, referring to FIG. 1, the present disclosure provides a method for manufacturing an antenna packaging structure radiating e-m waves in a horizontal direction, and the method includes:

S1: Providing a support substrate 11, forming a separation layer on the support substrate 11, and the obtained structure is shown in FIGS. 2 and 3.

Figure 4:
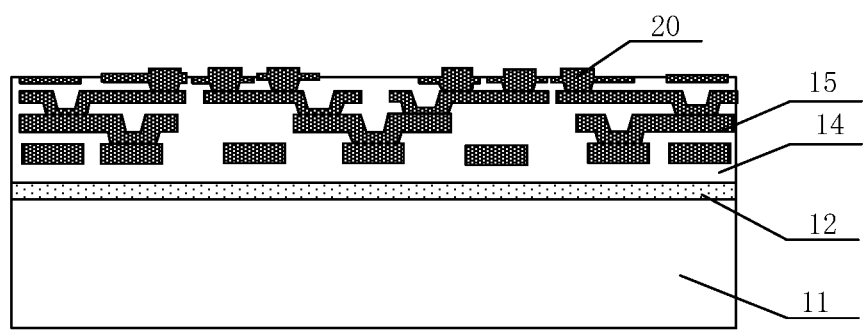

S2: Forming a rewiring layer on the separation layer, the rewiring layer includes a dielectric layer 14 and a metal wire layer 15 placed in the dielectric layer 14 and at a surface of the dielectric layer 14, and the obtained structure is shown in FIG. 4.

Figure 5:
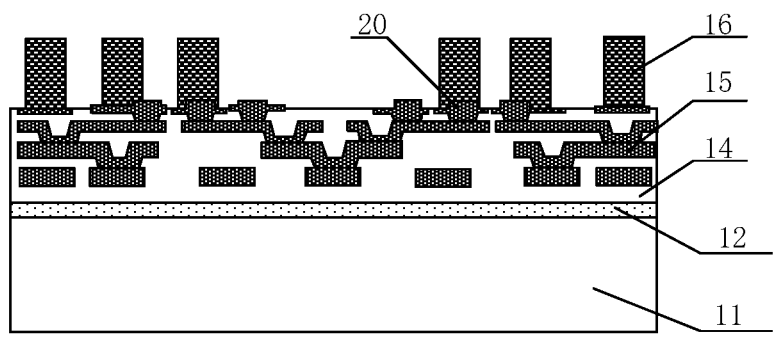
Figure 7:
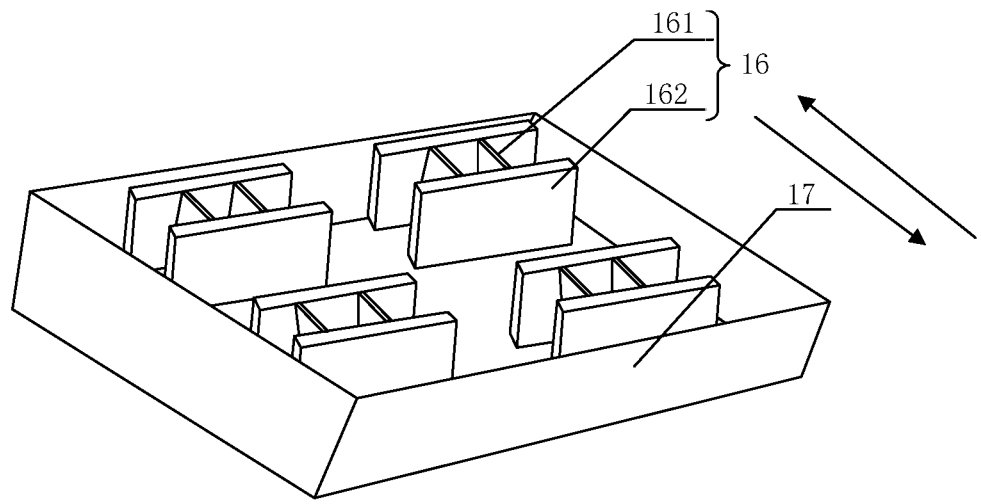

S3: Forming an antenna array layer on the rewiring layer, and the antenna array layer is electrically connected to the metal wire layer 15 (the metal wire layer 15 is used as an antenna feeder). The antenna array layer includes a plurality of antennas 16 arranged in an array, and the antennas 16 radiate electromagnetic waves in a horizontal direction, parallel to the substrate. Each of the antennas 16 includes a plurality of first metal sheets 161 extending along a first direction and a plurality of second metal sheets 162 extending along a second direction, the plurality of first metal sheets 161 is arranged with sheets in parallel and spaced by a sheet-to-sheet interval from each other, the plurality of second metal sheets 162 is arranged with sheets in parallel and spaced by a sheet-to-sheet interval from each other, and two side ends of each of the second metal sheets 162 are respectively connected to the first metal sheets 161. The first direction is not parallel to the second direction, and the obtained structure is shown in FIGS. 5 and 7.

Figure 6:
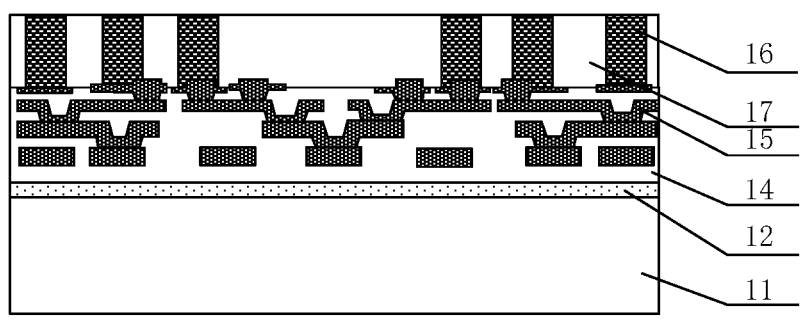

S4: Forming a molding material layer 17, the molding material layer 17 molds the antenna array layer, and the obtained structure is shown in FIG. 6.

Figure 8:
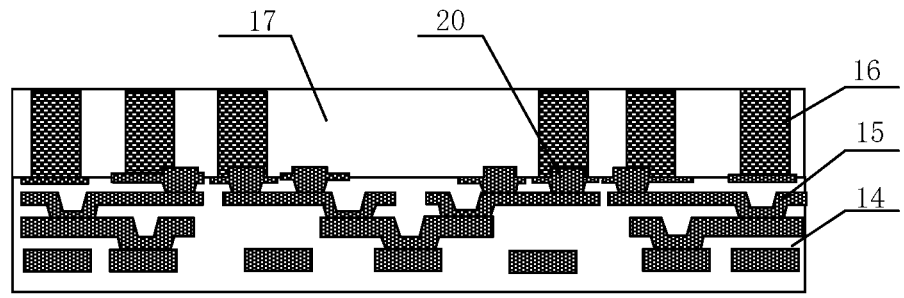
Figure 9:
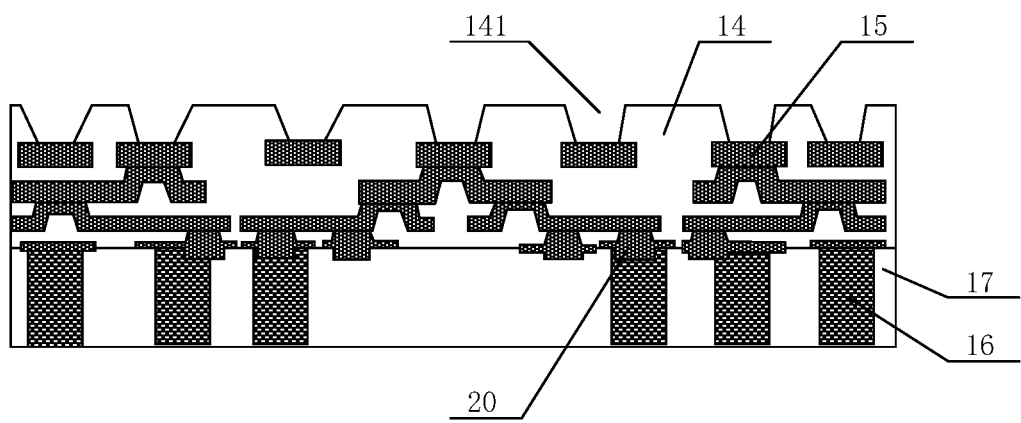

S5: Removing the support substrate 11 and the separation layer, and the obtained structure is shown in FIG. 8.

Figure 10:
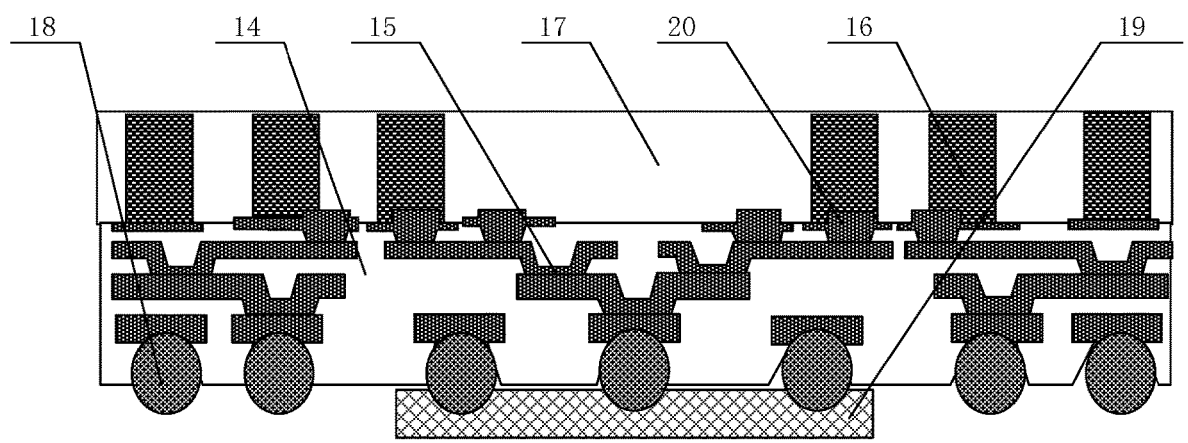

S6: Forming solder ball bumps 18 on a surface of the rewiring layer on the opposite side from the antenna array layer, the solder ball bumps 18 are electrically connected to the metal wire layer 15, and the obtained structure is shown in FIG. 10.

S7: A chip 19 is disposed on the solder ball bumps 18, and the obtained structure is shown also in FIG. 10.

In the present disclosure, the antenna is designed to radiate electromagnetic (e-m) waves in a horizontal direction (that is, to radiate e-m waves along the top surface of the package body), and the thickness of the antenna layer should not be more than ten micrometers thick, thereby reducing the thickness of the molding antenna layer, helping to increase the antenna radiating frequency and further reduce the size of the device. So the antenna structure can be designed with certain flexibility according to the requirements of the device, because antennas have more room to expand in the horizontal direction, more compact devices help to improve performance.

The support substrate 11, as its name implies, plays a supporting role to avoid defects such as bending and deformation during the device fabrication. As an example, the support substrate includes, but not limited to, a glass substrate, a silicon substrate, a sapphire substrate, a ceramic substrate, a metal substrate, or other materials that have certain hardness and are not prone to bending deformation. In this embodiment, a transparent substrate such as a quartz glass substrate is preferred, which helps to irradiate from the back side of the support substrate 11 with UV light when peeling off the separation layer from the support substrate 11. Before preparing the separation layer, the support substrate 11 may be cleaned and dried.

In one example, as shown in FIG. 3, the separation layer includes a release layer 12 and a protective layer 13, the release layer 12 is formed on a surface of the support substrate 11, and the protective layer 13 is formed on a surface of the release layer 12 facing away from the support substrate 11 for protecting the release layer 12. In other examples, the separation layer may only include the release layer 12. In a further example, the release layer 12 includes but not limited to one or more of a carbon material layer, a resin material layer, and an organic material layer, and the protective layer 13 includes but not limited to a polyimide layer. For example, the support substrate 11 may be a transparent substrate such as a quartz glass substrate, and the release layer 12 may be a UV resin layer. During the subsequent peeling process, the release layer 12 can be peeled off when it is irradiated from the back side of the support substrate 11. In some embodiments, the release layer 12 may be a light-to-heat conversion (LTHC) layer, and the LTHC layer may be irradiated by a laser in subsequent steps, so that the support substrate 11 is separated from the LTHC layer, thereby easing the peeling process and preventing device damage risk. The formation methods of the release layer 12 and the protective layer 13 can be determined according to their materials. For example, the formation methods may include spin coating, spray coating, and direct attachment.

As an example, the material of the dielectric layer 14 includes, but not limited to, epoxy resin, silica gel, PI, PBO, BCB, silicon oxide, phosphor-silicate glass, a combination of one or more of fluorine-containing glass, and other High K dielectric materials. The material of the metal wire layer 15 includes, but not limited to, a combination of one or more metals such as gold, silver, copper, and aluminum. The method for forming the dielectric layer 14 includes, but not limited to, vapor deposition, and the method for forming the metal wire layer 15 includes, but not limited to, a combination of one or more of sputtering, electroplating, and electroless plating. In an example, the process of forming the metal wire layer includes: first forming the dielectric layer 14 on the separation layer, and then forming an opening corresponding to the metal wire layer 15 in the dielectric layer 14 by using a photolithography process, and then forming a metal material layer in the opening and on a surface of the dielectric layer 14 to form the metal wire layer 15. Both the dielectric layer 14 and the metal wire layer 15 may have a single-layer or multi-layer structure, but it is necessary to ensure that different sub-layers of the metal wire layer 15 are electrically connected.

In an example, after the rewiring layer is formed, an under bump metallurgy (UBM) layer may be formed on a surface of the rewiring layer, the UBM layer 20 is electrically connected to the metal wire layer 15, and the antenna array layer 16 is formed on a surface of the UBM layer 20 and is electrically connected to the UBM layer 20. The UBM layer 20 may have a single-layer or multi-layer structure, and the method for forming the UBM layer 20 includes, but not limited to, one or a combination of sputtering and electroplating. For example, in one case, the UBM layer 20 includes a chromium layer, a chromium-copper (50%-50%) layer, or a copper layer from bottom to top plus a very thin gold layer may be disposed on the top surface of the UBM layer 20 to prevent oxidation of the copper layer. A diffusion layer may be disposed at the bottom of the UBM layer 20. The material of the diffusion layer may include lead-tin alloy, eutectic compound, and other components according to requirements from different applications, so that the UBM layer 20 is in better electrical contact with the metal wire layer 15.

As an example, the forming of the antenna array layer may include the following operations: forming an antenna metal layer on the rewiring layer by a method including but not limited to sputtering or electroplating, and the material of the antenna metal material layer includes but not limited to a single metal or a metal alloy of gold, silver, copper, etc.; coating a photoresist layer on the antenna metal layer, and exposing and developing the photoresist layer in a photolithography process to define the position and shape of the antenna 16 in the antenna metal layer; and etching the antenna metal layer to form the antenna array layer.

In an example, as shown in FIG. 7, there are a number of antenna structures each comprising two first metal sheets 161 and two second metal sheets 162, and the first direction of the two first metal sheets 161 extension is perpendicular to the second direction of the two second metal sheets 162 extension. The first metal sheet 161 and the second metal sheet 162 both extend in the horizontal direction (the length extending in the horizontal direction is greater than the thickness extending in the vertical direction), that is, the surfaces with relatively large surface areas in this example, the surfaces are rectangular shaped, are perpendicular to the horizontal surface of the molding layer, and the thicknesses of the sheets parallel to the horizontal surface are small, for example, less than 5000 nm. The first metal sheets 161 function as an array to guide and amplify the electromagnetic waves, the second metal sheets 162 play the role of radiating electromagnetic waves, the second metal sheets 162 radiate electromagnetic waves outward in the horizontal direction during operation, and the molding material between the metal sheets serves as a propagation dielectric medium to spread the electromagnetic waves radiated from the surfaces of the second metal sheets 162 along the horizontal direction (for example, the direction indicated by the arrow in FIG. 7). Since the antennas radiate in the horizontal direction, the thickness of the antenna layer is in a range of around one millimeter, and the thickness of the corresponding molding material layer can also be reduced to around a millimeter or less, which is helpful to increase the frequency of the antenna and further reduce the size of the device. In the meantime, the extension length of the antenna is only limited by the dimension of the device substrate. The extension length of the antenna in the horizontal direction can be extended, further improving antenna performance. In other examples, the antenna may also adopt other structures, which are not strictly limited.

As an example, the method of forming the molding material layer 17 includes, but not limited to, one or more of compression molding, transfer molding, liquid sealing molding, vacuum lamination, and spin coating, and the material of the molding material layer 17 may include one or more of polyimide, silicone, and epoxy. After the molding material layer 17 is formed, the molding material layer 17 may be planarized using grinding or polishing, to facilitate the subsequent process.

After the molding material layer 17 is formed, one or more methods including but not limited to grinding, laser irradiation, or heating are used to remove the support substrate 11 and the separation layer according to different materials of the support substrate 11 and the separation layer. If the aforementioned protective layer is formed, the protective layer may be simultaneously removed in this operation.

In one example, after removing the support substrate 11 and the separation layer, openings 141 may be formed in the dielectric layer 14, the openings 141 expose the metal wire layer 15, and the solder ball bumps 18 are formed in the openings 141. For example, the openings 141 are formed by laser drilling, and then the solder ball bumps 18 are formed in the openings 141 by a ball mount method, which helps to further ensure good electrical contact between the solder ball bumps 18 and the metal wire layer 15. The material of the solder ball bumps 18 includes, but not limited to, tin, gold, copper, tin alloy, gold alloy, and copper alloy.

As an example, the chip 19 may be bonded to the solder ball bumps 18 by a method including, but not limited to, instantaneous high temperature die bond. The chip 19 includes, but not limited to, various active and passive electrical elements, such as a power device, resistor, capacitor, etc. The chip 19 may be a single or a multiple element device.

In one example, before or after attaching the chip 19, an underfill layer may be formed between the solder ball bumps 18 and the chip 19, to form good protection for the chip 19 and the solder ball bumps 18. For example, after the chip 19 is disposed on the solder ball bumps 18, a sealing epoxy layer may be formed between the chip 19 and the solder ball bumps 18 by a method including but not limited to capillary filling. Or before disposing the chip 19 on the solder ball bumps 18, an underfill layer is formed on the surfaces of the solder ball bumps 18 and between the solder ball bumps 18, and then the underfill layer is etched by laser to form openings for exposing the solder ball bumps 18, and then the chip 19 is soldered to the surfaces of solder ball bumps 18 via these openings.

The present disclosure further provides an antenna packaging structure radiating e-m waves in a horizontal direction. The antenna packaging structure can be prepared by the method described in any of the foregoing solutions. The antenna packaging structure can also be prepared based on other methods, which will not be described here.

Specifically, as shown in FIG. 10, the antenna packaging structure radiating e-m waves in the horizontal direction includes a rewiring layer, an antenna array layer, a molding material layer, solder ball bumps and a chip.

The rewiring layer includes a first surface and a second surface opposite to the first surface, and the rewiring layer includes a dielectric layer 14 and a metal wire layer 15 placed in the dielectric layer 14 and on a surface of the dielectric layer 14.

The antenna array layer is placed on the first surface of the rewiring layer and is electrically connected to the metal wire layer 15. The antenna array layer includes a plurality of antennas 16 arranged in an array, for example, arranged in multiple rows and multiple columns (e.g., 2×2 array arrangement) or linear arrangement (i.e., single-row and multiple-column arrangement or multiple-row and single-column arrangement), which helps improve antenna performance. The antenna 16 radiates e-m waves in the horizontal direction. The antenna 16 includes a plurality of first metal sheets 161 extending along a first direction and a plurality of second metal sheets 162 extending along a second direction, the plurality of first metal sheets 161 is arranged with sheets in parallel and spaced by a sheet-to-sheet interval from each other, the plurality of second metal sheets 162 is arranged with sheets in parallel and spaced by a sheet-to-sheet interval from each other, and two ends of each of the second metal sheets 162 are respectively connected to the first metal sheets 161. The first direction is not parallel to the second direction.

The molding material layer 17 is placed on the first surface of the rewiring layer, and molds (completely or partially) the antenna array layer.

The solder ball bumps 18 are placed on the second surface of the rewiring layer and electrically connected to the metal wire layer 15.

The chip 19 is electrically connected to the solder ball bumps 18.

As an example, the dielectric layer 14 includes, but is not limited to, one or more of an epoxy resin layer, a silica gel layer, a polyimide (PI) layer, a polyphenylene benzoxazole (PBO) layer, a benzocyclobutene (BCB) layer, a silicon oxide layer, a phosphosilicate glass layer, a fluorine-containing glass layer; The metal wire layer 15 includes, but is not limited to, one or more of a gold layer, a silver layer, a copper layer, and an aluminum layer.

As an example, the material of the antenna 16 includes, but is not limited to, a single metal or metal alloy of gold, silver, and copper.

In an example, the antenna packaging structure radiating e-m waves in the horizontal direction further includes an under bump metallurgy layer 20, the under bump metallurgy layer 20 is placed on the second surface of the rewiring layer, and two ends of the under bump metallurgy 20 are respectively electrically connected to the metal wiring layer 15 and the solder ball bumps 18. In one example, the under bump metallurgy layer 20 includes a chromium layer, a chromium-copper (50%-50%) layer, and a copper layer from bottom to top.

In an example, the antenna 16 radiating e-m waves in the horizontal direction further includes an underfill layer, and the underfill layer is placed between the chip 19 and the solder ball bumps 18.

As an example, there are two first metal sheets 161 radiating e-m waves in the first direction and two second metal sheets 162 radiating e-m waves in the second direction. And as an example, the first direction is perpendicular to the second direction. The surfaces of the first metal sheets 161 and the second metal sheets 162 perpendicular to the horizontal plane have rectangular shapes, these surfaces are larger than the surfaces of the first metal sheets 161 and the second metal sheets 162 parallel to the horizontal plane. Or it can also be described as, the first metal sheets 161 and the second metal sheets 162 each includes a first surface and a second surface perpendicular to the first surface, the first surface is parallel to the horizontal plane, the second surface is perpendicular to the horizontal plane, and the area of the second surface is larger than the area of the first surface. That is, the first metal sheets 161 and the second metal sheets 162 are both thin plates, and the lengths of each is greater than the thickness and width.

By setting the antennas to radiate in the horizontal direction, the design of the antenna is less limited by the thickness of the molding process, and the flexibility of the antenna design can be improved.

In summary, the present disclosure provides a packaging structure radiating e-m waves in a horizontal direction and a method making the same. The method includes: providing a support substrate, and forming a separation layer on the support substrate; forming a rewiring layer on the separation layer, the rewiring layer includes a dielectric layer and a metal wire layer placed in the dielectric layer and on a surface of the dielectric layer; forming an antenna array layer on the rewiring layer, the antenna array layer is electrically connected to the metal wire layer; the antenna array layer includes a plurality of antennas arranged in an array, the plurality of antennas radiates in a horizontal direction; the plurality of antennas includes a plurality of first metal sheets extending along a first direction and a plurality of second metal sheets extending along a second direction, the plurality of first metal sheets is arranged in parallel and spaced by an interval from each other, the plurality of second metal sheets is arranged in parallel and spaced by an interval from each other, and two ends of each of the plurality of second metal sheets are respectively connected to the plurality of first metal sheets; the first direction is not parallel to the second direction; forming a molding material layer, the molding material layer molds the antenna array layer; removing the support substrate and the separation layer; forming solder ball bumps on a surface of the rewiring layer away from the antenna array layer, the solder ball bumps are electrically connected to the metal wire layer; and disposing the chip on the solder ball bumps. In the present disclosure, the antenna is designed to radiate in a horizontal direction, and does not need a thick antenna layer, thereby reducing the thickness of the molding antenna layer, helping to increase the antenna frequency and further reduce the size of the device, and the antenna structure can be flexibly designed according to the requirements of the device because the expansion space of the antenna in the horizontal direction is large, which helps to improve the performance of the device.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A method for making an antenna packaging structure radiating e-m waves in a horizontal direction, comprising:
   providing a support substrate in the horizontal direction, and forming a separation layer on the support substrate;
   forming a rewiring layer on the separation layer, wherein the rewiring layer includes a dielectric layer and a metal wire layer placed in the dielectric layer and on a surface of the dielectric layer;
   forming an antenna array layer on the rewiring layer, wherein the antenna array layer is electrically connected to the metal wire layer;
   wherein the antenna array layer comprises a plurality of antennas arranged in an array;
   wherein the plurality of antennas radiates electromagnetic waves in the horizontal direction;
   wherein the plurality of antennas each comprises a plurality of first metal sheets extending along a first horizontal direction and a plurality of second metal sheets extending along a second horizontal direction;
   wherein the plurality of first metal sheets is arranged with sheets in parallel and spaced by a sheet-to-sheet interval from each other;
   wherein the plurality of second metal sheets is arranged with sheets in parallel and spaced by a sheet-to-sheet interval from each other;
   wherein two ends of each of the plurality of second metal sheets are respectively connected to the plurality of first metal sheets; and wherein the first horizontal direction is perpendicular to the second horizontal direction;
forming a molding material layer, wherein the molding material layer molds the antenna array layer;
removing the support substrate and the separation layer;
forming solder ball bumps on a surface of the rewiring layer away from the antenna array layer, wherein the solder ball bumps are electrically connected to the metal wire layer; and
disposing a chip on the solder ball bumps.

2. The method for making the antenna packaging structure radiating e-m waves in the horizontal direction according to claim 1, wherein after removing the support substrate and the separation layer, the method further comprising:
forming openings in the dielectric layer, wherein the openings expose the metal wire layer, and forming the solder ball bumps in the openings.

3. The method for making the antenna packaging structure radiating e-m waves in the horizontal direction according to claim 1, wherein the plurality of antennas each comprises two first metal sheets extending in the first horizontal direction and two second metal sheets extending in the second horizontal direction.

4. The method for making the antenna packaging structure radiating e-m waves in the horizontal direction according to claim 1,
wherein the support substrate comprises a glass substrate;
wherein the separation layer includes a release layer and a protective layer,
wherein the release layer is formed on a surface of the support substrate,
wherein the protective layer is formed on a surface of the release layer facing away from the support substrate;
wherein the release layer comprises one or more of a carbon material layer, a resin material layer, and an organic material layer, and
wherein the protective layer comprises a polyimide layer.

5. The method for making the antenna packaging structure radiating e-m waves in the horizontal direction according to claim 1, wherein after the rewiring layer is formed, the method further comprises:
forming an under bump metallurgy (UBM) layer on the surface of the rewiring layer, wherein the UBM layer is electrically connected to the metal wire layer, and wherein the antenna array layer is formed on a surface of the UBM layer and is electrically connected to the UBM layer.

6. An antenna packaging structure radiating e-m waves in a horizontal direction, wherein the antenna packaging structure comprises:
a rewiring layer, comprising a first surface and a second surface opposite to the first surface, wherein the rewiring layer comprises a dielectric layer and a metal wire layer placed in the dielectric layer and on a surface of the dielectric layer;
an antenna array layer, placed on the first surface of the rewiring layer,
wherein the antenna array layer is electrically connected to the metal wire layer, and
wherein the antenna array layer comprises a plurality of antennas arranged in an array,
wherein the plurality of antennas radiates e-m waves in the horizontal direction, and
wherein the plurality of antennas comprises a plurality of first metal sheets extending along a first horizontal direction and a plurality of second metal sheets extending along a second horizontal direction,
wherein the plurality of first metal sheets is arranged with sheets in parallel and spaced by sheet-to-sheet interval from each other,
wherein the plurality of second metal sheets is arranged with sheets in parallel and spaced by a sheet-to-sheet interval from each other;
wherein two ends of each of the plurality of second metal sheets are respectively connected to the plurality of first metal sheets, and
wherein the first horizontal direction is not parallel to the second horizontal direction;
a molding material layer, placed on the first surface of the rewiring layer, and molding the antenna array layer;
solder ball bumps, placed on the second surface of the rewiring layer and electrically connected to the metal wire layer; and
a chip, electrically connected to the solder ball bumps.

7. The antenna packaging structure radiating e-m waves in the horizontal direction according to claim 6, further comprising an under bump metallurgy layer, wherein the under bump metallurgy layer is placed on the second surface of the rewiring layer, and two ends of the under bump metallurgy are respectively connected electrically to the metal wiring layer and the solder ball bumps.

8. The antenna packaging structure radiating e-m waves in the horizontal direction according to claim 6, further comprising an underfill layer, wherein the underfill layer is placed between the chip and the solder ball bumps.

9. The antenna packaging structure radiating e-m waves in the horizontal direction according to claim 6, wherein the plurality of antennas each comprises two first metal sheets and two second metal sheets.

10. The antenna packaging structure radiating e-m waves in the horizontal direction according to claim 6, wherein the first horizontal direction is perpendicular to the second horizontal direction.

* * * * *